(12) United States Patent
Yoshida et al.

(10) Patent No.: US 9,129,901 B2
(45) Date of Patent: Sep. 8, 2015

(54) POLISHING METHOD OF NON-OXIDE SINGLE-CRYSTAL SUBSTRATE

(71) Applicant: ASAHI GLASS COMPANY, LIMITED, Chiyoda-ku (JP)

(72) Inventors: Iori Yoshida, Chiyoda-ku (JP); Satoshi Takemiya, Chiyoda-ku (JP); Hiroyuki Tomonaga, Chiyoda-ku (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 14/064,397

(22) Filed: Oct. 28, 2013

(65) Prior Publication Data

US 2014/0057438 A1   Feb. 27, 2014

Related U.S. Application Data

(63) Continuation of application No. PCT/JP2012/060577, filed on Apr. 19, 2012.

(30) Foreign Application Priority Data

Apr. 26, 2011  (JP) .................................. 2011-097832

(51) Int. Cl.
*H01L 21/306*   (2006.01)
*H01L 21/02*   (2006.01)
(Continued)

(52) U.S. Cl.
CPC ............ *H01L 21/30625* (2013.01); *C09G 1/04* (2013.01); *H01L 21/02024* (2013.01); *H01L 29/1608* (2013.01)

(58) Field of Classification Search
CPC ..................... H01L 21/02024; H01L 29/1608; H01L 21/30625; C09G 1/04

USPC ....................................... 216/88, 90; 438/692
See application file for complete search history.

(56) References Cited

U.S. PATENT DOCUMENTS 7,678,700 B2   3/2010   Desai et al.
7,998,866 B2   8/2011   White et al.
(Continued)

FOREIGN PATENT DOCUMENTS

DE   10 2006 033 919   3/2007
EP   1 950 263   7/2008
(Continued)

OTHER PUBLICATIONS

English language translation of the International Preliminary Report on Patentability and Written Opinion issued Nov. 7, 2013 in PCT/JP2012/060577.

(Continued)

*Primary Examiner* — Shamim Ahmed
(74) *Attorney, Agent, or Firm* — Oblon, McClelland, Maier & Neustadt, L.L.P.

(57) ABSTRACT

There is provided a polishing method for polishing a non-oxide single-crystal substrate such as a silicon carbide single-crystal substrate at a high polishing rate to obtain a high-quality surface that is smooth and excellent in surface properties. This polishing method is a method of supplying a polishing liquid to a polishing pad not including abrasive grains to bring a surface to be polished of the non-oxide single-crystal substrate and the polishing pad into contact with each other and polishing the surface to be polished by a relative movement between them, the method characterized in that the polishing liquid comprises: an oxidant whose redox potential is 0.5 V or more and which contains a transition metal; and water, and does not contain abrasive grains.

9 Claims, 1 Drawing Sheet

(51) Int. Cl.
*C09G 1/04* (2006.01)
*H01L 29/16* (2006.01)

(56) References Cited

U.S. PATENT DOCUMENTS

| | | | |
|---|---|---|---|
| 8,647,527 B2 * | 2/2014 | Hotta et al. | 252/79.3 |
| 2003/0139069 A1 * | 7/2003 | Block et al. | 438/962 |
| 2005/0059247 A1 | 3/2005 | Ikenaka | |
| 2007/0021040 A1 | 1/2007 | Kawata et al. | |
| 2007/0039926 A1 | 2/2007 | Cherian et al. | |
| 2007/0147551 A1 | 6/2007 | Mabuchi et al. | |
| 2008/0153292 A1 | 6/2008 | White et al. | |
| 2008/0173843 A1 | 7/2008 | Hotta et al. | |
| 2008/0305718 A1 | 12/2008 | Kawata et al. | |
| 2009/0273060 A1 * | 11/2009 | Ishibashi et al. | 257/615 |
| 2010/0006982 A1 * | 1/2010 | Hashii et al. | 257/618 |
| 2010/0258528 A1 * | 10/2010 | Singh et al. | 216/53 |
| 2010/0260977 A1 | 10/2010 | Singh et al. | |
| 2010/0279506 A1 * | 11/2010 | White et al. | 438/693 |
| 2010/0291761 A1 * | 11/2010 | Storck et al. | 438/493 |
| 2010/0323586 A1 * | 12/2010 | Pietsch | 451/41 |
| 2011/0084363 A1 | 4/2011 | Ishibashi et al. | |
| 2011/0156058 A1 * | 6/2011 | Hori et al. | 257/77 |
| 2012/0190200 A1 * | 7/2012 | Penta et al. | 438/692 |

FOREIGN PATENT DOCUMENTS

| | | |
|---|---|---|
| JP | 2005-117027 | 4/2005 |
| JP | 2007-027663 | 2/2007 |
| JP | 2008-068390 | 3/2008 |
| JP | 2008-068390 A * | 3/2008 |
| JP | 2008-179655 | 8/2008 |
| JP | 2009-238891 | 10/2009 |
| JP | 2009-241224 | 10/2009 |
| KR | 10-2007-0012209 | 1/2007 |
| KR | 2008-0078854 | 8/2008 |
| WO | 2007-021716 | 2/2007 |
| WO | 2009-111001 | 9/2009 |

OTHER PUBLICATIONS

International Search Report issued Jul. 10, 2012 in PCT/JP2012/060577 filed Apr. 19, 2012.
U.S. Appl. No. 14/197,844, filed Mar. 5, 2014, Yoshida, et al.
U.S. Appl. No. 14/095,384, filed Dec. 3, 2013, Yoshida et al.
Office Action as received in the corresponding Korean Patent Application No. 2013-7026891 dated Oct. 20, 2014.
Office Action as received in the corresponding German Patent Application No. 112012001891.5 dated Dec. 12, 2014.
Summons to Attend Oral Proceedings as received in the corresponding Germany Patent Application No. 112012001891.5 dated Jul. 1, 2015.

* cited by examiner

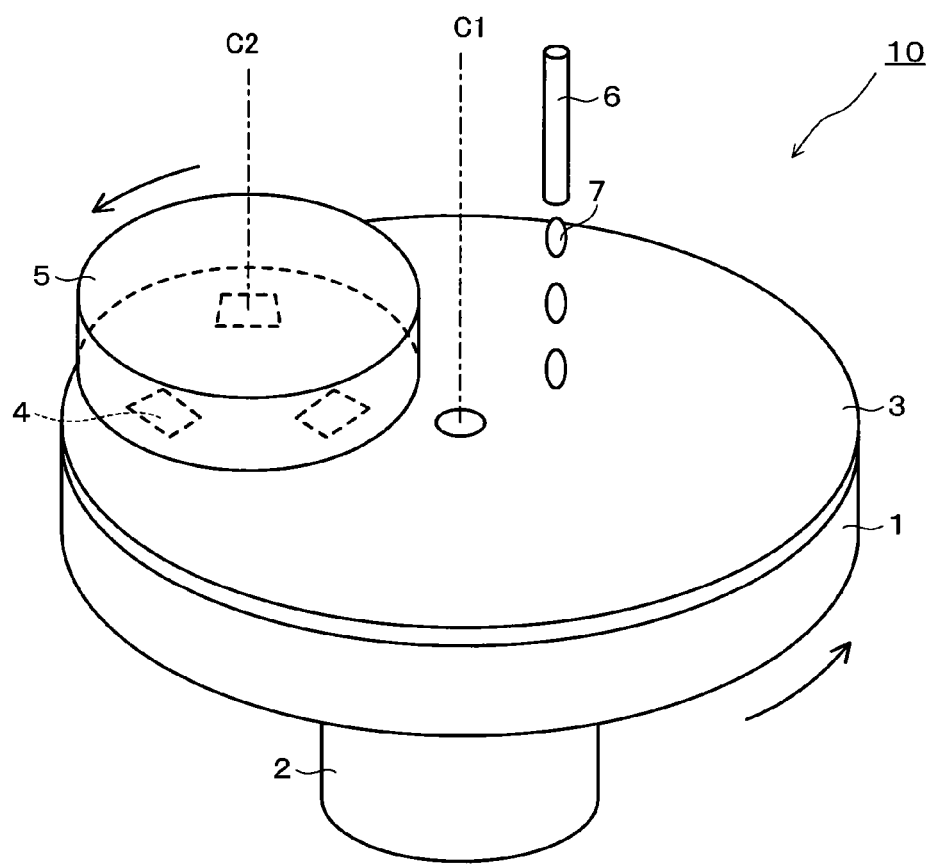

POLISHING METHOD OF NON-OXIDE SINGLE-CRYSTAL SUBSTRATE

CROSS-REFERENCE TO RELATED APPLICATIONS

This application is a continuation of prior International Application No. PCT/JP2012/060577, filed on Apr. 19, 2012 which is based upon and claims the benefit of priority from Japanese Patent Application No. 2011-097832 filed on Apr. 26, 2011; the entire contents of all of which are incorporated herein by reference.

FIELD

The present invention relates to a polishing method for polishing a non-oxide single-crystal substrate. More particularly, it relates to a polishing method suitable for final polishing of a silicon carbide single-crystal substrate and the like.

BACKGROUND

Because a silicon carbide (SiC) semiconductor is higher in dielectric breakdown field, saturated drift velocity of electrons, and thermal conductivity than a silicon semiconductor, researches and developments have been made on the use of the silicon carbide semiconductor for realizing a power device capable of operating at higher temperatures and at a higher speed than conventional silicon devices. The development of a highly efficient switching element used in power sources for driving motors of electric bicycles, electric vehicles, hybrid cars and the like has been drawing attention. In order to realize such a power device, a silicon carbide single-crystal substrate having a smooth surface is required as a substrate where to epitaxially grow a high-quality silicon carbide semiconductor layer.

Further, as a light source for high-density information recording, a blue laser diode has been drawing attention, and a need for a white diode as a light source to replace fluorescent lamps and bulbs is also increasing. A gallium nitride (GaN) semiconductor is used to fabricate such a light-emitting element, and as a substrate where to form a high-quality gallium nitride semiconductor layer, a silicon carbide single-crystal substrate is used.

For the silicon carbide single-crystal substrate for such applications, high machining accuracy is required in terms of flatness of the substrate, smoothness of the surface of the substrate, and the like. However, because a silicon carbide single crystal has very high hardness and excellent corrosion resistance, its workability when the substrate is fabricated is poor, which makes it difficult to obtain the silicon carbide single-crystal substrate having high smoothness.

Generally, a smooth surface of a semiconductor single-crystal substrate is formed by polishing. When a silicon carbide single crystal is polished, abrasive grains of diamond or the like harder than silicon carbide are used to mechanically polish the surface to form the flat surface, but minute scratches according to a particle size of the diamond abrasive grains are introduced in the surface of the silicon carbide single-crystal substrate polished by the diamond abrasive grains. Further, since a work-affected layer having a mechanical strain is generated in the surface, the surface of the silicon carbide single-crystal substrate does not have sufficient smoothness as it is.

In the manufacture of the semiconductor single-crystal substrate, as a method for smoothing the surface of the semiconductor substrate having undergone the mechanical polishing, chemical mechanical polishing (sometimes hereinafter referred to as CMP) technology is used. The CMP is a method to use a chemical reaction such as oxidation to change a workpiece to an oxide or the like and use abrasive grains lower in hardness than the workpiece to remove the generated oxide, thereby polishing its surface. This method has an advantage of being capable of forming a very smooth surface without causing a strain in the surface of the workpiece.

As a polishing agent for more smoothly polishing the surface of the silicon carbide single-crystal substrate by the CMP, a polishing composition with pH4 to 9 containing colloidal silica has been conventionally known (refer to JP-A 2005-117027 (KOKAI), for example). There has also been proposed a polishing composition containing silica abrasive grains, an oxidant such as hydrogen peroxide (oxygen imparting agent), and vanadate (refer to JP-A 2008-179655 (KOKAI), for example). Furthermore, there has also been proposed a polishing composition containing abrasive grains of alumina, titania, ceria, zirconia, or the like, an oxidant such as hydrogen peroxide, permanganate, or periodate, and a dispersion medium (refer to WO 2009/111001 A1, for example).

However, in the use of the polishing composition described in JP-A 2005-117027 (KOKAI), a polishing rate for the silicon carbide single-crystal substrate is low and thus it takes a very long time for the polishing. Further, the use of the polishing composition described in JP-A 2008-179655 (KOKAI) has a problem that a polishing rate is not high enough and thus it takes a long time for the polishing. Further, the use of the polishing composition described in WO 2009/111001 A1 also has a problem that aggregation of the abrasive grains occurs in a short time and it is not possible to obtain a sufficient polishing rate.

There has been proposed a method of smoothly polishing a surface of a silicon carbide single-crystal substrate or the like in the presence of an oxidative polishing liquid by using a polishing pad including abrasive grains (refer to JP-A 2008-068390 (KOKAI), for example). However, in the method described in JP-A 2008-068390 (KOKAI), a polishing rate is not high enough and the surface suffers damage such as a scratch or a strain due to a strong mechanical action of the fixed abrasive grains. Further, it is difficult to adjust a particle size, the content, and content distribution of the abrasive grains included in the polishing pad and is difficult to obtain a smooth surface after the polishing.

SUMMARY OF THE INVENTION

The present invention has been made in order to solve the above-mentioned problems, and its object is to provide a method for polishing a non-oxide single-crystal substrate high in hardness and high in chemical stability, such as a silicon carbide single-crystal substrate, at a high polishing rate to obtain a smooth surface.

A method of polishing a non-oxide single-crystal substrate of the present invention is a method of supplying a polishing liquid to a polishing pad not including abrasive grains to bring a surface to be polished of the non-oxide single-crystal substrate and the polishing pad into contact with each other and polishing the surface to be polished by a relative movement between them, wherein the polishing liquid comprises: an oxidant whose redox potential is 0.5 V or more and which contains a transition metal; and water, and does not contain abrasive grains.

In the polishing method of the non-oxide single-crystal substrate of the present invention, the oxidant is preferably a permanganate ion. Further, a content of the permanganate ion in the polishing liquid is preferably not less than 0.05 mass % nor more than 5 mass %. Furthermore, pH of the polishing liquid is preferably 11 or less, and more preferably 5 or less. The non-oxide single-crystal substrate can be a silicon carbide single-crystal substrate or a gallium nitride single-crystal substrate.

According to the polishing method of the present invention, it is possible to polish, at a high polishing rate, a surface to be polished of a non-oxide single-crystal substrate high in hardness and high in chemical stability, such as a silicon carbide single-crystal substrate or a gallium nitride single-crystal substrate, and it is possible to obtain a flat and smooth polished surface. Further, since a polishing liquid does not contain abrasive grains, there is no concern that aggregation of the abrasive grains causes the unstable supply of the polishing liquid and the generation of scratches and the like in the polished surface, and the stable and high-speed polishing is enabled. In the present invention, "surface to be polished" means a surface that is polished, of an object to be polished, and for example, its front surface.

BRIEF DESCRIPTION OF THE DRAWINGS

FIG. 1 is a view showing an example of a polishing apparatus which can be used in an embodiment of the polishing method of the present invention.

DETAILED DESCRIPTION

Hereinafter, embodiments of the present invention will be described.
[Polishing Method]

A polishing method of a non-oxide single-crystal substrate of the present invention is a method of supplying a polishing liquid to a polishing pad not including abrasive grains to bring a surface to be polished of the non-oxide single-crystal substrate being a object to be polished and the polishing pad into contact with each other and polishing the surface to be polished by a relative movement between the surface to be polished and the polishing pad. Further, it is characterized in that, as the polishing liquid, used is a polishing liquid comprising an oxidant which contains a transition metal and whose redox potential is 0.5 V or more; and water, and not containing abrasive grains.

The polishing liquid used in the polishing method of the present invention does not contain abrasive grains, but contains the highly oxidative oxidant whose redox potential is 0.5 V or more and which contains the transition metal. Therefore, even by the polishing method of the present invention which supplies the polishing liquid to the polishing pad not including the abrasive grains to perform the polishing, it is possible to polish, at a sufficiently high polishing rate, the surface to be polished of the non-oxide single-crystal substrate high in hardness and high in chemical stability, such as a SiC single-crystal substrate, and to obtain the surface that is flat, smooth, and excellent in surface properties.

Note that pH of the polishing liquid is preferably 11 or less. In order to adjust pH to 11 or less, a pH adjusting agent can be added to the polishing liquid. When pH of the polishing liquid is 11 or less, the oxidant acts effectively, resulting in a high polishing rate and a good polishing property. Hereinafter, components and pH of the polishing liquid will be described in detail.
[Polishing Liquid]
(Oxidant)

The oxidant contained in the polishing liquid having a 0.5 V redox potential or more and containing the transition metal, is intended to form an oxide layer on the surface of a later-described object to be polished (for example, a SiC single-crystal substrate or a GaN single-crystal substrate). Removing the oxide layer from the polished surface by a mechanical force promotes the polishing of the object to be polished. Specifically, a compound semiconductor of SiC, GaN, or the like is a non-oxide and is a material hard to be polished, but the oxide layer can be formed on its surface owing to the oxidant having a 0.5 V redox potential or more and containing the transition metal, in the polishing liquid. Being lower in hardness and thus more easily polished compared with the object to be polished, the formed oxide layer can be removed even by being brought into contact with the polishing pad not containing the abrasive grains. Therefore, it is possible to obtain a sufficiently high polishing rate.

Examples of the oxidant having a 0.5 V redox potential or more and containing the transition metal, in the polishing liquid, are permanganate ion, vanadate ion, dichromate ion, ceric ammonium nitrate, iron(III) nitrate nonahydrate, silver nitrate, phosphotungstic acid, tungstosilicic acid, phosphomolybdic acid, phosphotungstomolybdic acid, phosphovanadomolybdic acid, and so on, and especially preferable is permanganate ion. As a supply source of permanganate ion, permanganate such as potassium permanganate or sodium permanganate is preferable.

Reasons why permanganate ion is especially preferable as the oxidant in the polishing of the SiC single-crystal substrate are shown below.

(1) Permanganate ion has a strong oxidizing power to oxidize the SiC single crystal.

When the oxidizing power of the oxidant is too weak, its reaction with the surface to be polished of the SiC single-crystal substrate becomes insufficient, resulting in inability to obtain a sufficiently smooth surface. As an index of the oxidizing power with which the oxidant oxidizes a substance, a redox potential is used. Permanganate ion has a 1.70 V redox potential and is higher in the redox potential compared with potassium perchlorate ($KClO_4$) (redox potential 1.20 V) and sodium hypochlorite (NaClO) (redox potential 1.63 V) which are commonly used as an oxidant.

(2) The reaction rate of permanganate ion is high.

Being higher in the reaction rate of the oxidation reaction compared with hydrogen peroxide (redox potential 1.76 V) known as an oxidant having a strong oxidizing power, permanganate ion can quickly exhibit the strong oxidizing power.

(3) Permanganate ion has low toxicity to human bodies and thus is safe.

(4) Permanganate is completely dissolved in water being a later-described dispersion medium. Therefore, there is no adverse effect of dissolution residues on smoothness of the substrate.

In order to obtain a high polishing rate, a content ratio (concentration) of the permanganate ion in the polishing liquid is preferably not less than 0.05 mass % nor more than 5 mass %. When it is less than 0.05 mass %, the effect as the oxidant cannot be expected, and it may take a very long time to form the smooth surface by the polishing. When the content ratio of the permanganate ion is more than 5 mass %, depending on the temperature of the polishing liquid, the permanganate is not completely dissolved to precipitate, which may cause scratches due to the contact of the solid permanganate with the surface to be polished. The content ratio of the permanganate ion contained in the polishing liquid is more preferably not less than 0.1 mass % nor more than 4 mass %, especially preferably not less than 0.2 mass % nor more than 3.5 mass %, and very preferably not less than 1.0 mass % nor more than 3.5 mass %.

(Abrasive Grains)

The polishing liquid used in the present invention does not substantially contain silicon oxide (silica) grains, cerium oxide (ceria) grains, aluminum oxide (alumina) grains, zirconium oxide (zirconia) grains, titanium oxide (titania) grains, or the like. The polishing liquid not containing abrasive grains has advantages that the polishing liquid can be used without any consideration given to dispersibility of the abrasive grains, and damages to the surface of the object to be polished can be suppressed because substantially no aggregation of the abrasive grains occurs. (pH and pH Adjusting Agent)

PH of the polishing liquid used in the present invention is preferably 11 or less, more preferably 5 or less, and especially preferably 3 or less, in view of the polishing property. When pH is over 11, it may not be possible to obtain a sufficiently high polishing rate and in addition the smoothness of the surface to be polished may deteriorate.

pH of the polishing liquid can be adjusted by the addition/mixture of acid or a basic compound being a pH adjusting agent. As the acid, an inorganic acid such as nitric acid, sulfuric acid, phosphoric acid, or hydrochloric acid; an inorganic acid including saturated carboxylic acid such as formic acid, acetic acid, propionic acid, or butyric acid; hydroxy acid such as lactic acid, malic acid, or citric acid; aromatic carboxylic acid such as phthalic acid or salicylic acid; dicarboxylic acid such as oxalic acid, malonic acid, succinic acid, glutaric acid, adipic acid, fumaric acid, or maleic acid; amino acid or heterocyclic carboxylic acid. The use of nitric acid or phosphoric acid is preferable, and above all, the use of nitric acid is especially preferable. As the basic compound, usable are ammonia, lithium hydroxide, potassium hydroxide, sodium hydroxide, a quaternary ammonium compound such as tetramethyl ammonium, and organic amine such as monoethanolamine, ethyl ethanolamine, diethanolamine, and propylene diamine. The use of potassium hydroxide or sodium hydroxide is preferable, and above all, the use of potassium hydroxide is especially preferable.

The content ratio (concentration) of these acids or basic compounds is set to an amount so that pH of the polishing liquid is adjusted to the predetermined range (pH11 or less, more preferably 5 or less, still more preferably 3 or less).

(Water)

Water is contained as the dispersion medium in the polishing liquid used in the present invention. The water is a medium for dispersing and dissolving the oxidant and later-described optional components which are added when necessary. With respect to water, there is no particular limitation. However, pure water, ultrapure water, or ion-exchanged water (deionized water) is preferred in view of an influence on other compounding components, the contamination of impurities, and an influence on pH or the like.

(Preparation of Polishing Liquid and Optional Components)

The polishing liquid used in the present invention is prepared so that the aforesaid components are contained at the predetermined ratio and are in a mixed state where they are uniformly dissolved, and used. For the mixing, it is possible to adopt a stirring and mixing method by a stirring blade commonly used in the manufacture of a polishing liquid. The polishing liquid does not necessarily have to be supplied to a polishing site as one in which all the polishing components are mixed in advance. At the time of the supply to the polishing site, the polishing components may be mixed to form the composition of the polishing liquid.

When necessary, the polishing liquid can contain a lubricant, a chelating agent, a reducing agent, a viscosity imparting agent or a viscosity modifier, an anti-corrosion agent, and so on within the range not impairing the above-mentioned effects of the present invention. However, when these additives have a function of an oxidant, acid, or a basic compound, they are each handled as the basic compound, the acid, or the basic compound.

As the lubricant, an anionic, cationic, nonionic, or amphoteric surfactant, a polysaccharide, a water-soluble polymer, or the like can be used.

As the surfactant, usable is one which has an aliphatic hydrocarbon group and an aromatic hydrocarbon group as hydrophobic groups and in which one binding group or more such as ester, ether, or amide and one connecting group or more such as an acyl group and an alkoxyl group are introduced into these hydrophobic groups, or one having, as a hydrophilic group, carboxylic acid, sulfonic acid, sulfate ester, phosphoric acid, phosphoric acid ester, or amino acid can be used.

As the polysaccharide, alginic acid, pectin, carboxymethylcellulose, curdlan, pullulan, xanthan gum, carrageenan, gellan gum, locust bean gum, gum arabic, tamarind, psyllium, or the like can be used.

As the water-soluble polymer, polyacrylic acid, polyvinyl alcohol, polyvinyl pyrrolidone, polymethacrylic acid, polyacrylamide, polyaspartic acid, polyglutamic acid, polyethyleneimine, polyallylamine, polystyrene sulfonic acid, and the like can be used.

[Object to be Polished]

The object to be polished by using the polishing liquid of the invention is a non-oxide single-crystal substrate. Examples of the non-oxide single-crystal substrate are compound semiconductor substrates such as a SiC single-crystal substrate and a GaN single-crystal substrate. In particular, by polishing the surface to be polished of the single-crystal substrate whose modified Mohs hardness is 10 or more, such as the aforesaid SiC single-crystal substrate or GaN single-crystal substrate by using the polishing liquid of the invention, it is possible to obtain the effect of improving the polishing rate more.

[Polishing Method]

The polishing method of the present invention is a method in which the well-known polishing pad not including the abrasive grains is used, and while the aforesaid polishing liquid is supplied to this polishing pad, the surface to be polished of the non-oxide single-crystal substrate being the object to be polished and the polishing pad are brought into contact with each other, and the surface to be polished is polished by the relative movement between the surface to be polished and the polishing pad.

In the polishing method of the present invention, a conventionally known polishing apparatus can be used. FIG. 1 shows an example of the polishing apparatus usable in the embodiment of the present invention, but the polishing apparatus used in the present invention is not limited to one having such a structure.

The polishing apparatus 10 shown in FIG. 1 is provided with a polishing platen 1 which is supported to be rotatable around its vertical axis C1, and the polishing platen 1 is driven to rotate in the direction indicated by the arrow in the drawing by a platen driving motor 2. On an upper surface of this polishing platen 1, a well-known polishing pad 3 not including abrasive grains is affixed.

On the polishing platen 1, at a position eccentric from the axis C1, a substrate holding member (carrier) 5 for holding a object 4 to be polished such as a SiC single-crystal substrate on its lower surface by using suction, a holding frame, or the like is supported to be rotatable around its axis C2 and to be movable in a direction along the axis C2. The substrate holding member 5 is rotated in the direction indicated by the arrow by a not-shown carrier driving motor or by a rotational moment received from the aforesaid polishing platen 1. On the lower surface of the substrate holding member 5, that is, on its surface facing the aforesaid polishing pad 3, the non-oxide single-crystal substrate being the object 4 to be polished is held. The object 4 to be polished is pressed against the polishing pad 3 by a predetermined load.

Near the substrate holding member 5, a dripping nozzle 6 or a spray nozzle (not shown) is provided, so that the above-described polishing liquid 7 fed from a not-shown tank is supplied onto the polishing platen 1.

At the time of the polishing by such a polishing apparatus 10, the polishing platen 1 and the polishing pad 3 affixed thereon, and the substrate holding member 5 and the object 4 to be polished supported on the its lower surface are driven to rotate around their axes by the platen driving motor 2 and the carrier driving motor, respectively. Then, in this state, the polishing liquid 7 is supplied from the dripping nozzle 6 or the like to the surface of the polishing pad 3, and the object 4 to be polished held by the substrate holding member 5 is pressed against the polishing pad 3. Consequently, the surface to be polished of the object 4 to be polished, that is, its surface facing the polishing pad 3, is chemically and mechanically polished.

The substrate holding member 5 may perform not only the rotational movement but also a linear movement. Further, the polishing platen 1 and the polishing pad 3 may be those not performing the rotational movement, and for example, may move in one direction by a belt system.

As the polishing pad 3, a well-known one made of non-woven fabric, a porous resin such as foamed polyurethane, or the like and not containing abrasive grains can be used. Further, to accelerate the supply of the polishing liquid 7 to the polishing pad 3 or to allow a certain amount of the polishing liquid 7 to stay in the polishing pad 3, the surface of the polishing pad 3 may be worked to have a groove in a lattice shape, a concentric shape, a spiral shape, or the like. Further, when necessary, a pad conditioner may be brought into contact with the surface of the polishing pad 3 to perform the conditioning of the surface of the polishing pad 3.

A condition of the polishing by such a polishing apparatus 10 is not particularly limited, but it is possible to increase a polishing pressure and improve the polishing rate by applying a load to the substrate holding member 5 to press it against the polishing pad 3. The polishing pressure is preferably about 5 to 80 kPa, and in view of uniformity of the polishing rate in the surface to be polished, flatness, and the prevention of a polishing defect such as a scratch, the polishing pressure is more preferably about 10 to 50 kPa. The rotation speed of the polishing platen 1 and the substrate holding member 5 is preferably about 50 to 500 rpm but is not limited thereto. Further, a supply amount of the polishing liquid 7 is appropriately adjusted and selected according to the composition of the polishing liquid, the aforesaid polishing condition, and so on.

EXAMPLES

The present invention will be hereinafter concretely described based on working examples and comparative examples, but the present invention should not be limited to these working examples. Examples 1-15, an example 20, an example 21, an example 23, an example 25, examples 28-29, and an example 31 are the working examples. Examples 16-19, an example 22, an example 24, examples 26-27, an example 30, and an example 32 are the comparative examples.

Examples 1-32

(1) Preparation of Polishing Liquid and Abrasive Agent Liquid (1-1)

In each of the examples 1-15, the example 20, the example 21, the example 23, the example 25, the examples 28-29, and the example 31 being the working examples, a polishing liquid was prepared in the following manner. First, pure water was added to potassium permanganate being an oxidant shown in Table 1 and Table 2, and the mixture was stirred for ten minutes by using a stirring blade. Next, a pH adjusting agent shown in Table 1 and Table 2 (phosphoric acid, nitric acid, potassium hydroxide, or sodium hydroxide) was gradually added to the liquid while the stirring was performed, to adjust pH to a certain value shown in Table 1 and Table 2, whereby the polishing liquid was obtained. Content ratios (concentrations; mass %) of components used in each of the working examples to the whole polishing liquid are shown in Table 1 and Table 2. Note that the oxidant concentration in Table 1 and Table 2 is not the concentration of permanganate ion being ion but is the concentration of potassium permanganate.

(1-2)

In each of the examples 16-19, the example 22, the example 24, the examples 26-27, the example 30, and the example 32 being the comparative examples, an abrasive liquid containing abrasive grains was prepared in the following manner. In the example 16, pure water was added to a colloidal silica dispersion (about 40 mass % silica solids) whose average primary particle size was 40 nm and whose average secondary particle size was about 70 nm, and the mixture was stirred for ten minutes by using a stirring blade. Next, ammonium vanadate as metal salt was added to this liquid while the stirring was performed, and finally hydrogen peroxide was added and the mixture was stirred for thirty minutes, whereby the abrasive liquid in which the component concentrations were adjusted to certain values shown in Table 1 was obtained.

In each of the examples 17-19, pure water was added to a colloidal silica dispersion (about 40 mass % silica solids) whose average primary particle size was 80 nm and whose average secondary particle size was about 110 nm, and the mixture was stirred for ten minutes. Next, potassium permanganate being an oxidant was added to the liquid while the stirring was performed, and when necessary, phosphoric acid or nitric acid was gradually added to adjust pH to a certain value shown in Table 1, whereby the abrasive liquid was obtained.

In each of the example 22, the example 24, the examples 26-27, the example 30, and the example 32, pure water was added to a cerium oxide dispersion (about 30 mass % ceria solids) whose average secondary particle size was 30 nm, and the mixture was stirred for ten minutes. Next, potassium permanganate as an oxidant was added to this liquid while the stirring was performed, and nitric acid was further gradually added to adjust pH to a certain value shown in Table 2, whereby the abrasive liquid was obtained. Content ratios (concentrations; mass %) of components used in each of the comparative examples to the whole abrasive liquid are shown in Table 1 and Table 2. Note that the oxidant concentration in Table 1 and Table 2 is not the concentration of permanganate ion but is the concentration of potassium permanganate.

The average primary particle size of the silica particles compounded in the examples 16 to 19 was found by conversion from a specific surface area obtained by a BET method, and the average secondary particle size was measured by Microtrac UPA (manufactured by NIKKISO Co., Ltd.). Further, the average secondary particle size of the cerium oxide particles compounded in the example 22, the example 24, the examples 26-27, the example 30, and the example 32 was measured by Microtrac UPA (manufactured by NIKKISO Co., Ltd.).

(2) Measurement of pH

PH of the polishing liquids obtained in the examples 1-15, the example 20, the example 21, the example 23, the example 25, the examples 28-29, and the example 31 and the abrasive liquids obtained in the examples 16-19, the example 22, the example 24, the examples 26-27, the example 30, and the example 32 was measured at 25° C. by using pH81-11 manufactured by Yokogawa Electric Corporation. Results of the measurement are shown in Table 1 and Table 2.

(3) Evaluation of Polishing Properties and Abrasive Grain Settling Properties of Polishing Liquids and Abrasive Liquids Regarding the polishing liquids obtained in the examples 1-15, the example 20, the example 21, the example 23, the example 25, the examples 28-29, and the example 31 and the abrasive liquids obtained in the examples 16-19, the example 22, the example 24, the examples 26-27, the example 30, and the example 32, polishing properties and abrasive grain settling properties were evaluated.

(3-1) Polishing Condition

As a polishing machine, a small-size polishing apparatus manufactured by MAT Inc. was used. As a polishing pad, SUBA800-XY-groove (manufactured by Nitta Haas Incorporated) was used, and the conditioning of the polishing pad was performed by using a diamond disk and a brush before the polishing.

A feeding rate of the polishing liquids or the abrasive liquids was set to 25 cm³/minute, the rotation speed of the polishing platen was set to 68 rpm, the rotation speed of the substrate holding member was set to 68 rpm, the polishing pressure was set to 5 psi (34.5 kPa), and the polishing was performed for thirty minutes.

(3-2) Object to be Polished

As an object to be polished, a 4H-SiC substrate with a 3 inch diameter having undergone a preliminary polishing process using diamond abrasive grains was used, and a SiC single-crystal substrate whose main surface (0001) was within 0°+0.25° with respect to a C axis (hereinafter referred to as an On-axis substrate) and a SiC single-crystal substrate whose an off-angle of the main surface with respect to a C axis was within 4°±0.5° were used, and their Si surface sides were polished, and the evaluation was conducted. Note that regarding the polishing liquids or the abrasive liquids of the examples 1-2, the example 8, the example 11, and the example 17-33, only the polishing property (polishing rate) for the SiC single-crystal substrate whose off-angle was within 4° (hereinafter referred to as a 4° off substrate) was evaluated. Further, regarding the polishing liquids of the example 4, the example 10, and the example 15, only the polishing property (polishing rate) for the On-axis substrate was evaluated.

(3-3) Measurement of Polishing Rate

The polishing rate was evaluated based on an amount (nm/hr) of change in thickness of each of the substrates (wafers) per unit time. Specifically, a mass of each of the unpolished substrates with a known thickness and a mass of each of the substrates after polished for each period of time were measured, and the mass change was determined from the difference between them. Further, the change in thickness of the substrates per period of time determined from the mass change was calculated using the following formulas. The calculation results of the polishing rate are shown in Table 1 and Table 2.

(Formulas for Calculating Polishing Rate (V))

$$\Delta m = m0 - m1$$

$$V = \Delta m / m0 \times T0 \times 60 / t$$

(in the formulas, $\Delta m$ (g) represents the mass change between before and after the polishing, $m0$ (g) represents the initial mass of the unpolished substrate, $m1$ (g) represents the mass of the substrate after polished, V represents the polishing rate (nm/hr), $T0$ represents the thickness (nm) of the unpolished substrate, and t represents the polishing time (min)).

(3-4) Evaluation of Abrasive Grain Settling Property

The evaluation of the abrasive grain settling property was made in such a manner that the abrasive liquids obtained in the examples 16-19, the example 22, the example 24, the examples 26-27, the example 30, and the example 32 were put into 20 ml test tubes to be left standstill, and the time until a settled layer of the abrasive grains was visually confirmed on bottoms of the test tubes was measured. Incidentally, a case where the settled layer was not confirmed even after five minutes passed was evaluated as "no aggregation".

TABLE 1

| E* | Kind of abrasive grains | Concentration of abrasive grains (mass %) | Secondary particle size of abrasive grains (μm) | Kind of oxidant | Concentration of oxidant (mass %) | Kind of metal salt | Concentration of metal salt (mass %) | pH adjusting agent | pH | Polishing rate for 4° off substrate (nm/hr) | Polishing rate for On-axis substrate (nm/hr) | Evaluation of abrasive grain settling property |
|---|---|---|---|---|---|---|---|---|---|---|---|---|
| 1 | — | — | — | potassium permanganate | 1.58 | — | — | phosphoric acid | 2 | 413 | — | — |
| 2 | — | — | — | potassium permanganate | 0.50 | — | — | phosphoric acid | 2 | 179 | — | — |
| 3 | — | — | — | potassium permanganate | 3.16 | — | — | phosphoric acid | 2 | 861 | 621 | — |
| 4 | — | — | — | potassium permanganate | 0.35 | — | — | phosphoric acid | 2 | — | 126 | — |
| 5 | — | — | — | potassium permanganate | 3.16 | — | — | phosphoric acid | 5 | 736 | 454 | — |
| 6 | — | — | — | potassium permanganate | 3.16 | — | — | — | 8 | 674 | 454 | — |

TABLE 1-continued

| E* | Kind of abrasive grains | Concentration of abrasive grains (mass %) | Secondary particle size of abrasive grains (μm) | Kind of oxidant | Concentration of oxidant (mass %) | Kind of metal salt | Concentration of metal salt (mass %) | pH adjusting agent | pH | Polishing rate for 4° off substrate (nm/hr) | Polishing rate for On-axis substrate (nm/hr) | Evaluation of abrasive grain settling property |
|---|---|---|---|---|---|---|---|---|---|---|---|---|
| 7 | — | — | — | potassium permanganate | 3.16 | — | — | KOH | 10 | 569 | 399 | — |
| 8 | — | — | — | potassium permanganate | 3.16 | — | — | NaOH | 10 | 592 | — | — |
| 9 | — | — | — | potassium permanganate | 1.58 | — | — | nitric acid | 2 | 824 | 523 | — |
| 10 | — | — | — | potassium permanganate | 0.10 | — | — | nitric acid | 2 | — | 124 | — |
| 11 | — | — | — | potassium permanganate | 0.20 | — | — | nitric acid | 2 | 153 | — | — |
| 12 | — | — | — | potassium permanganate | 3.16 | — | — | nitric acid | 2 | 1167 | 784 | — |
| 13 | — | — | — | potassium permanganate | 3.16 | — | — | nitric acid | 3 | 916 | 703 | — |
| 14 | — | — | — | potassium permanganate | 3.16 | — | — | nitric acid | 5 | 522 | 399 | — |
| 15 | — | — | — | potassium permanganate | 2.37 | — | — | nitric acid | 2 | — | 621 | — |
| 16 | colloidal silica | 20 | 0.07 | hydrogen peroxide | 1.00 | ammonium vanadate | 0.50 | — | 6.5 | 83 | 69 | no aggregation |
| 17 | colloidal silica | 20 | 0.11 | potassium permanganate | 1.58 | — | — | phosphoric acid | 2 | 28 | — | no aggregation |
| 18 | colloidal silica | 20 | 0.11 | potassium permanganate | 1.58 | — | — | nitric acid | 2 | 69 | — | no aggregation |
| 19 | colloidal silica | 20 | 0.11 | potassium permanganate | 1.58 | — | — | — | 8 | 83 | — | no aggregation |

E* = Example

TABLE 2

| E* | Kind of abrasive grains | Concentration of abrasive grains (mass %) | Secondary particle size of abrasive grains (μm) | Kind of oxidant | Concentration of oxidant (mass %) | Kind of metal salt | Concentration of metal salt (mass %) | pH adjusting agent | pH | Polishing rate for 4° off substrate (nm/hr) | Polishing rate for On-axis substrate (nm/hr) | Evaluation of abrasive grain settling property |
|---|---|---|---|---|---|---|---|---|---|---|---|---|
| 20 | — | — | — | potassium permanganate | 0.30 | — | — | nitric acid | 2 | 220 | — | — |
| 21 | — | — | — | potassium permanganate | 0.50 | — | — | nitric acid | 5 | 275 | — | — |
| 22 | cerium oxide | 0.6 | 0.03 | potassium permanganate | 0.50 | — | — | nitric acid | 5 | 139 | — | aggregated in less than 5 minutes |
| 23 | — | — | — | potassium permanganate | 1.58 | — | — | nitric acid | 3.5 | 468 | — | — |
| 24 | cerium oxide | 0.6 | 0.03 | potassium permanganate | 1.58 | — | — | nitric acid | 3.5 | 220 | — | aggregated in less than 5 minutes |
| 25 | — | — | — | potassium permanganate | 3.16 | — | — | nitric acid | 3.5 | 833 | — | — |
| 26 | cerium oxide | 0.6 | 0.03 | potassium permanganate | 3.16 | — | — | nitric acid | 3.5 | 344 | — | aggregated in less than 5 minutes |
| 27 | cerium oxide | 0.6 | 0.03 | potassium permanganate | 3.16 | — | — | nitric acid | 5 | 361 | — | aggregated in less than 5 minutes |
| 28 | — | — | — | potassium permanganate | 5.00 | — | — | nitric acid | 2 | 1333 | — | — |
| 29 | — | — | — | potassium permanganate | 5.00 | — | — | nitric acid | 3.5 | 944 | — | — |
| 30 | cerium oxide | 0.6 | 0.03 | potassium permanganate | 5.00 | — | — | nitric acid | 3.5 | 472 | — | aggregated in less than 5 minutes |
| 31 | — | — | — | potassium permanganate | 5.00 | — | — | nitric acid | 5 | 894 | — | — |
| 32 | cerium oxide | 0.6 | 0.03 | | 5.00 | — | — | nitric acid | 5 | 509 | — | aggregated in less than 5 minutes |

E* = Example

As will be seen from Table 1 and Table 2, when the polishing liquids of the examples 1-15, the example 20, the example 21, the example 23, the example 25, the examples 28-29, and the example 31 being the working examples are used, a high polishing rate is obtained for at least one of the On-axis substrate and the 4° off substrate, and especially when the polishing liquids of the example 3, the examples 5-7, the example 9, and the examples 12-14 are used, a high polishing rate is obtained for both of the On-axis substrate and the 4° off substrate, and therefore, high-speed polishing is possible. Further, when any of the polishing liquids of the examples 1-15, the example 20, the example 21, the example 23, the example 25, the examples 28-29, and the example 31 is used, no scratch due to the polishing occurs in the surface to be polished of the SiC single-crystal substrate, and the polished surface excellent in flatness and smoothness is obtained.

On the other hand, when the abrasive liquid of the example 16 containing colloidal silica, hydrogen peroxide, and ammonium vanadate is used, the polishing rate is lower as compared with the cases where the polishing liquids of the examples 1-15, the example 20, the example 21, the example 23, the example 25, the examples 28-29, and the example 31 are used.

Further, when the abrasive liquids of the examples 17-19 containing potassium permanganate being the oxidant and further containing colloidal silica as the abrasive grains are used, no aggregation of the abrasive grains is confirmed in the evaluation of the abrasive grain settling property, but the polishing rate is far lower as compared with the cases where the polishing liquids of the examples 1-15, the example 20, the example 21, the example 23, the example 25, the examples 28-29, and the example 31 not containing colloidal silica are used.

When the abrasive liquids of the example 22, the example 24, the examples 26-27, the example 30, and the example 32 containing potassium permanganate as the oxidant and containing cerium oxide as the abrasive grains are used, the polishing rate is lower as compared with the cases where the polishing liquids of the example 20, the example 21, the example 23, the example 25, the examples 28-29, and the example 31 which have the same concentration of the oxidant and the same pH except that they do not contain the abrasive grains are used.

In addition, from the evaluation of the abrasive grain settling property, the aggregation of the abrasive grains was confirmed in less than five minutes when the abrasive liquids of the example 22, the example 24, the examples 26-27, the example 30, and the example 32 containing cerium oxide as the abrasive grains were used. Such abrasive liquids have a difficulty in the stable supply to the polishing apparatus and may cause the occurrence of scratches due to the aggregated abrasive grains.

According to the present invention, it is possible to polish a non-oxide single-crystal substrate, in particular, a compound semiconductor substrate high in hardness and high in chemical stability, such as a SiC single-crystal substrate and a GaN single-crystal substrate, at a high polishing rate, and to obtain a polished surface free from scratches and excellent in flatness and smoothness. Therefore, it is possible to contribute to an improvement in productivity of these substrates.

The present invention has been described in detail while referring to specific embodiments, but, it is obvious for a person skilled in the art that the invention can be variously modified and changed without departing from the scope and the spirit of the present invention.

What is claimed is:

1. A method of polishing a surface of a silicon carbide (SiC) non-oxide single-crystal substrate, the method comprising polishing the surface with a polishing pad in the presence of a polishing liquid by moving the polishing pad relative to the surface,
wherein the polishing liquid comprises a permanganate ion as an oxidant whose redox potential is 0.5 V or more and which contains a transition metal; and water, and
wherein the polishing pad and the polishing liquid do not contain abrasive grains.

2. The method of claim 1, wherein the permanganate ion is present in the polishing liquid in an amount of not less than 0.05 mass % nor more than 5 mass %.

3. The method of claim 1, wherein the polishing liquid has a pH of 11 or less.

4. The method of claim 3, wherein the polishing liquid has a pH of 5 or less.

5. The method of claim 1, wherein the oxidant is potassium permanganate or sodium permanganate.

6. The method of claim 2, wherein the permanganate ion is present in an amount of not less than 0.1 mass % nor more than 4 mass %.

7. The method of claim 2, wherein the permanganate ion is present in an amount of not less than 0.2 mass % nor more than 3.5 mass %.

8. The method of claim 2, wherein the permanganate ion is present in an amount of not less than 1.0 mass % nor more than 3.5 mass %.

9. The method of claim 4, wherein the polishing liquid has a pH of 3 or less.

* * * * *